US012062546B2

(12) United States Patent
Yoshida et al.

(10) Patent No.: US 12,062,546 B2
(45) Date of Patent: Aug. 13, 2024

(54) SUBSTRATE PROCESSING DEVICE, MANUFACTURING METHOD FOR SEMICONDUCTOR DEVICE, AND REACTION TUBE

(71) Applicant: KOKUSAI ELECTRIC CORPORATION, Tokyo (JP)

(72) Inventors: Hidenari Yoshida, Toyama (JP); Shigeru Odake, Toyama (JP); Tomoshi Taniyama, Toyama (JP); Takayuki Nakada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 451 days.

(21) Appl. No.: 17/166,256

(22) Filed: Feb. 3, 2021

(65) Prior Publication Data
US 2021/0159083 A1 May 27, 2021

Related U.S. Application Data

(63) Continuation of application No. 16/561,695, filed on Sep. 5, 2019, now Pat. No. 10,950,457, which is a
(Continued)

(51) Int. Cl.
*H01L 21/31* (2006.01)
*C23C 16/34* (2006.01)
(Continued)

(52) U.S. Cl.
CPC ........... *H01L 21/31* (2013.01); *C23C 16/345* (2013.01); *C23C 16/455* (2013.01);
(Continued)

(58) Field of Classification Search
CPC ........... C23C 16/45546; C23C 16/455; C23C 16/45561; C23C 16/45563; C23C 16/45578
See application file for complete search history.

(56) References Cited

U.S. PATENT DOCUMENTS

2006/0150905 A1\* 7/2006 Sakai ............... C23C 16/455
118/715
2007/0137794 A1\* 6/2007 Qiu ................ C23C 16/4584
118/725
(Continued)

FOREIGN PATENT DOCUMENTS

JP   H05-198517 A   8/1993
JP   2000-294511 A   10/2000
(Continued)

OTHER PUBLICATIONS

Korean Office Action issued on Sep. 1, 2020 for Korean Patent Application No. 10-2020-7016533.
(Continued)

*Primary Examiner* — Joseph A Miller, Jr.
(74) *Attorney, Agent, or Firm* — Volpe Koenig

(57) ABSTRACT

A substrate processing apparatus includes: a substrate holding member configured to hold a plurality of substrates; a reaction tube configured to accommodate the substrate holding member and process the substrates; a processing gas supply system configured to supply a processing gas into the reaction tube; and an exhaust system configured to exhaust an internal atmosphere of the reaction tube. The reaction tube includes: a cylindrical portion; a gas supply area formed outside one side wall of the cylindrical portion and connected to the processing gas supply system; and a gas exhaust area formed outside the other side wall of the cylindrical portion opposed to the gas supply area and connected to the exhaust system. Each of the gas supply area and the gas exhaust area has an inner wall which partitions the interior of each of the gas supply area and the gas exhaust area into a plurality of spaces.

18 Claims, 9 Drawing Sheets

Related U.S. Application Data continuation of application No. 15/513,027, filed as application No. PCT/JP2014/076023 on Sep. 30, 2014, now Pat. No. 10,811,271.

(51) Int. Cl.
  *C23C 16/455* (2006.01)
  *H01L 21/02* (2006.01)
  *H01L 21/67* (2006.01)

(52) U.S. Cl.
  CPC .. *C23C 16/45546* (2013.01); *C23C 16/45561* (2013.01); *C23C 16/45563* (2013.01); *C23C 16/45578* (2013.01); *H01L 21/0217* (2013.01); *H01L 21/02211* (2013.01); *H01L 21/0228* (2013.01); *H01L 21/67109* (2013.01); *H01L 21/67248* (2013.01)

(56) References Cited

U.S. PATENT DOCUMENTS

| | | | |
|---|---|---|---|
| 2008/0083372 A1 | 4/2008 | Inoue et al. | |
| 2009/0197424 A1 | 8/2009 | Sakai et al. | |
| 2009/0305512 A1 | 12/2009 | Matsuura et al. | |
| 2010/0083898 A1* | 4/2010 | Kogura | C23C 16/45546 |
| | | | 118/692 |
| 2010/0326358 A1 | 12/2010 | Choi | |
| 2011/0031593 A1 | 2/2011 | Saito et al. | |
| 2011/0186984 A1* | 8/2011 | Saito | C23C 16/45546 |
| | | | 257/E23.012 |
| 2012/0156888 A1 | 6/2012 | Sato et al. | |
| 2013/0252439 A1 | 9/2013 | Hirose et al. | |
| 2014/0283750 A1 | 9/2014 | Okada et al. | |

FOREIGN PATENT DOCUMENTS

| | | |
|---|---|---|
| JP | 2001-077042 A | 3/2001 |
| JP | 2002-222806 A | 8/2002 |
| JP | 2004-162114 A | 6/2004 |
| JP | 2005-317734 A | 11/2005 |
| JP | 2007-109711 A | 4/2007 |
| JP | 2011-052319 A | 3/2011 |
| JP | 2011-512031 A | 4/2011 |
| JP | 2014-207435 A | 10/2014 |
| KR | 10-2008-0012793 A | 2/2008 |
| KR | 10-2009-0087174 A | 8/2009 |
| KR | 10-2012-0069583 A | 6/2012 |
| KR | 10-2013-0107232 A | 10/2013 |
| WO | 2013/073887 A1 | 5/2013 |

OTHER PUBLICATIONS

Non-Final Office Action dated Jan. 3, 2020 for U.S. Appl. No. 15/513,027.

* cited by examiner

FIG. 8
(RELATED ART)
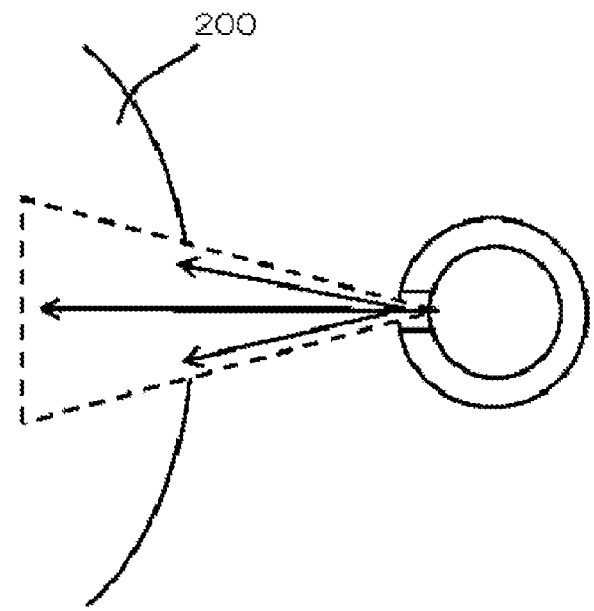
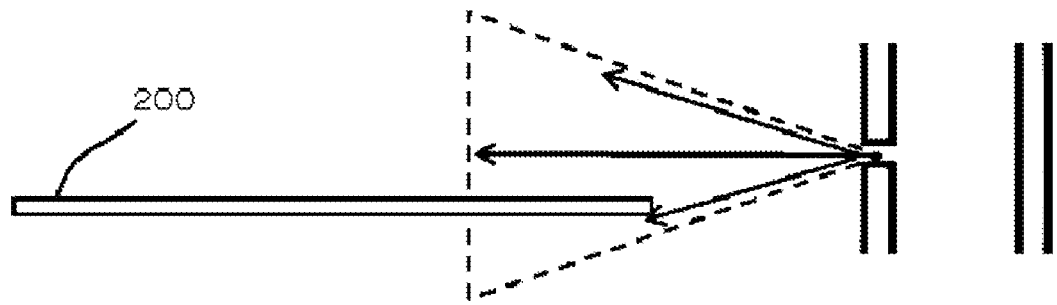

FIG. 9
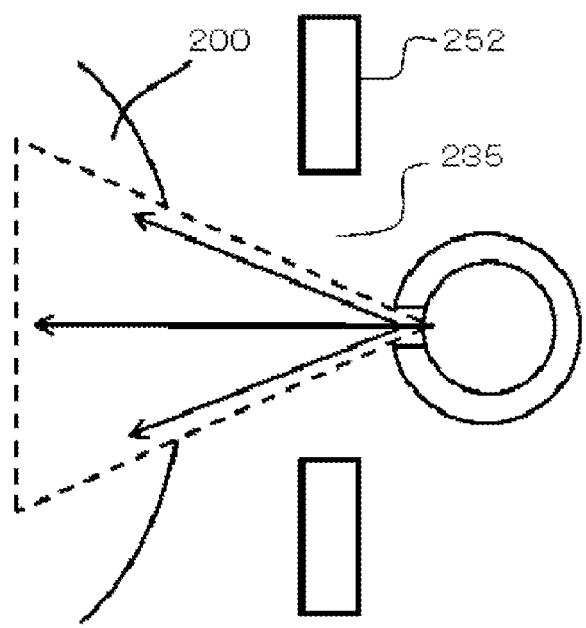
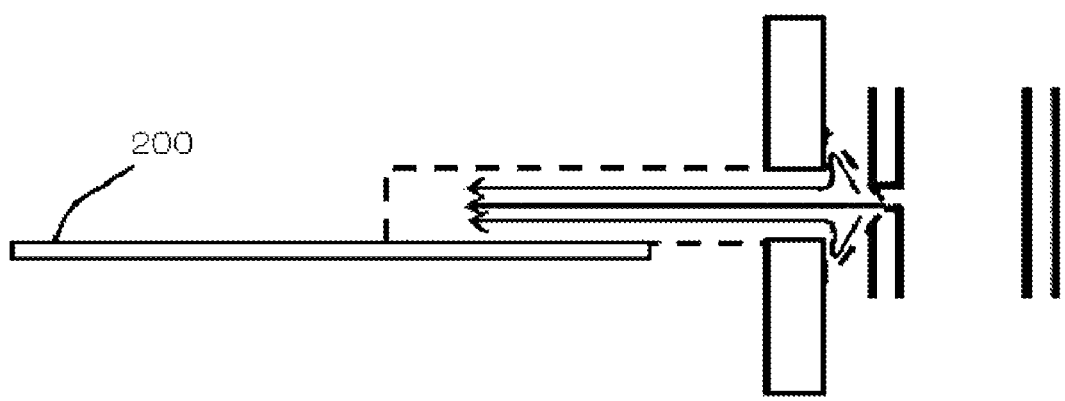

SUBSTRATE PROCESSING DEVICE, MANUFACTURING METHOD FOR SEMICONDUCTOR DEVICE, AND REACTION TUBE

CROSS REFERENCE TO RELATED PATENT APPLICATION

This application is a continuation of U.S. patent application Ser. No. 16/561,695, filed on Sep. 5, 2019, which is a continuation of U.S. patent application Ser. No. 15/513,027, filed Mar. 21, 2017, which is based upon and claims the benefit of priority under 35 U.S.C. § 119 of International Application No. PCT/JP2014/076023, filed on Sep. 30, 2014, in the WIPO, the entire contents of which are hereby incorporated by reference.

TECHNICAL FIELD

The present disclosure relates to a substrate processing apparatus, a method of manufacturing a semiconductor device, and a reaction tube.

BACKGROUND

As known in the art, there is a semiconductor manufacturing apparatus as an example of a substrate processing apparatus and there is a vertical type apparatus as an example of the semiconductor manufacturing apparatus. It is also known that this type of substrate processing apparatus includes a boat as a substrate holding member for holding substrates (wafers) in multiple stages in a reaction tube and processes the substrates in a process chamber in the reaction tube in a state where these substrates are held.

Patent Document 1 discloses a technique in which, in a state where a boat 217 in which a plurality of wafers 200 are held in multiple stages is disposed in a reaction tube 203, two or more kinds of precursor gases are simultaneously supplied to the wafers 200 to form a film on each of the wafers 200.

PRIOR ART DOCUMENTS

Patent Document

Japanese laid-open publication No. 2011-52319

However, the technique disclosed in Patent Document 1 has a problem of poor film thickness uniformity due to an insufficient amount of precursor gas supplied between one wafer and another and a problem of deterioration of productivity due to low replacement efficiency of the precursor gas to increase the processing time.

The object of the present disclosure is to provide a technique capable of improving film thickness uniformity while increasing productivity.

SUMMARY

According to one embodiment of the present disclosure, there is provided a substrate processing apparatus including:
   a substrate holding member configured to hold a plurality of substrates;
   a reaction tube configured to accommodate the substrate holding member and process the substrates;
   a processing gas supply system configured to supply a processing gas into the reaction tube; and
   an exhaust system configured to exhaust an internal atmosphere of the reaction tube,
   wherein the reaction tube includes:
   a cylindrical portion with its upper end closed and its lower end opened;
   a gas supply area which is formed outside one side wall of the cylindrical portion and to which the processing gas supply system is connected; and
   a gas exhaust area which is formed outside the other side wall of the cylindrical portion opposed to the gas supply area and to which the exhaust system is connected, and
   wherein each of the gas supply area and the gas exhaust area has an inner wall which partitions the interior of each of the gas supply area and the gas exhaust area into a plurality of spaces.

According to the present disclosure, it is possible to provide a technique capable of improving film thickness uniformity while increasing productivity.

BRIEF DESCRIPTION OF THE DRAWINGS

FIG. 8 is a schematic view illustrating a flow of processing gas in a conventional example.

FIG. 9 is a schematic view illustrating a flow of processing gas in the present disclosure.

DETAILED DESCRIPTION

A first embodiment of the present disclosure will now be described with reference to FIG. 1. A substrate processing apparatus in the present disclosure is configured as one example of a semiconductor manufacturing apparatus used for manufacturing a semiconductor device.

Figure 1:
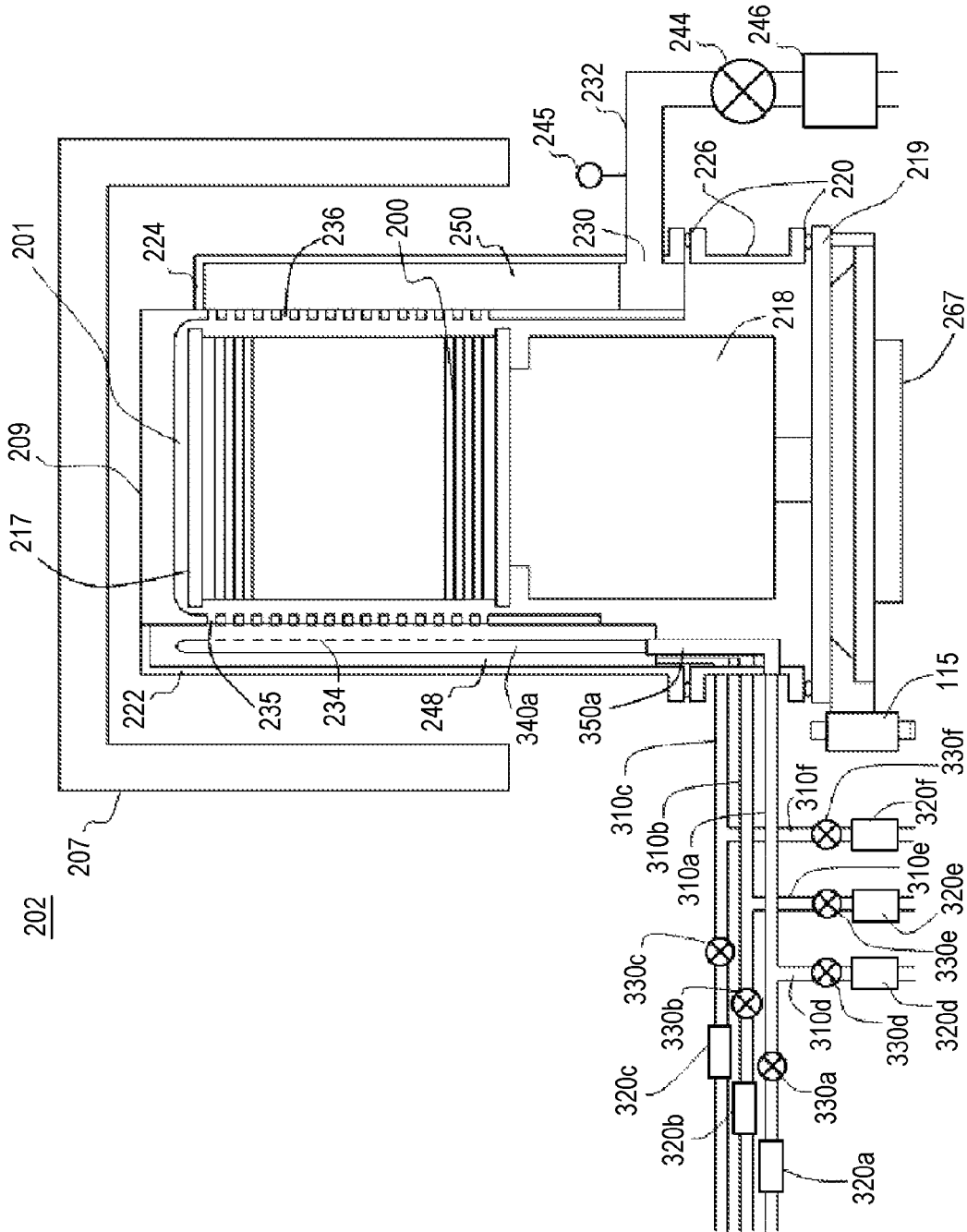
FIG. 1 is a schematic configuration view of a vertical processing furnace of a substrate processing apparatus suitably used in an embodiment of the present disclosure, in which a portion of the processing furnace is shown in a longitudinal section.

As shown in FIG. 1, a processing furnace 202 includes a heater 207 as a heating device (a heating mechanism). The heater 207 has a cylindrical shape and is supported by a heat base (not shown) serving as a support plate so as to be vertically installed. The heater 207 functions as an activation mechanism (an excitation part) configured to thermally activate (excite) a processing gas.

A reaction tube 203 of a single pipe structure constituting a reaction vessel (a process vessel) is disposed inside the heater 207 in a concentric relationship with the heater 207. The reaction tube 203 is made of, e.g., a heat resistant material such as quartz ($SiO_2$), silicon carbide (SiC) or the like. The reaction tube 203 is formed in the shape of a ceiling with its lower end portion opened and its upper end portion closed by a flat wall body. The side wall of the reaction tube 203 has a cylindrical portion 209 formed in a cylindrical shape, and a gas supply area 222 and a gas exhaust area 224, which are formed in the outer wall of the cylindrical portion 209. A process chamber 201 is formed inside the cylindrical portion 209 of the reaction tube 203. The process chamber 201 is configured to process wafers 200 as substrates. In addition, the process chamber 201 is configured to accommodate a boat 217 that can hold the wafers 200 in a state in which the wafers 200 are vertically arranged in multiple stages in a horizontal posture.

The gas supply area 222 is formed in such a manner that its convex portion protrudes toward the outside of one side wall of the cylindrical portion 209. The outer wall of the gas supply area 222 is larger than the outer diameter of the cylindrical portion 209 in the outside of one side wall as a portion of the outer wall of the cylindrical portion 209 and is formed in a concentric relationship with the cylindrical portion 209. The gas supply area 222 is formed in the shape of a ceiling with its lower end portion opened and its upper end portion closed by a flat wall body. The gas supply area 222 accommodates nozzles 410a to 410c (which will be described later) along its lengthwise direction (vertical direction). The gas supply area 222 has a boundary wall 252, which is a wall body forming a boundary between the gas supply area 222 and the cylindrical portion 209. Gas supply slits 235 to be described later are formed in the boundary wall 252. The boundary wall 252 corresponds to one side wall of the cylindrical portion 209 and its outer side surface constitutes a side portion facing the gas supply area 222.

The gas exhaust area 224 is formed in the other side wall of the cylindrical portion 209 facing the one side wall thereof in which the gas supply area 222 is formed. The gas exhaust area 224 is placed in such a manner that a region where the wafers 200 of the process chamber 201 are accommodated is sandwiched between the gas exhaust area 224 and the gas supply area 222. The gas exhaust area 224 is formed in such a manner that its convex portion protrudes toward the outside of the other side wall of the cylindrical portion 209 facing the one side wall thereof in which the gas supply area 222 is formed. The outer wall of the gas exhaust area 224 is larger than the outer diameter of the cylindrical portion 209 in the outside of the other side wall as a portion of the outer wall of the cylindrical portion 209 and is formed in a concentric relationship with the cylindrical portion 209. The gas exhaust area 224 is formed in the shape of a ceiling with its lower end portion and its upper end portion closed by flat wall bodies.

Gas exhaust slits 236 (which will be described later) are formed in a boundary wall 254 which is a wall body forming a boundary between the gas exhaust area 224 and the cylindrical portion 209. The boundary wall 254 is a part of the cylindrical portion 209 and the outer surface thereof forms a side portion facing the gas exhaust area 224.

The lower end of the reaction tube 203 is supported by a cylindrical manifold 226. The manifold 226 is made of metal such as a nickel alloy or stainless steel, or is made of a heat resistant material such as quartz ($SiO_2$) or silicon carbide (SiC). A flange is formed at the upper end portion of the manifold 226, and the lower end portion of the reaction tube 203 is installed on and supported by this flange. A seal member 220 such as an O-ring is interposed between the flange and the lower end portion of the reaction tube 203 to keep the interior of the reaction tube 203 airtight.

A seal cap 219 is air-tightly attached to an opening at the lower end of the manifold 226 via the seal member 220 such as an O-ring or the like so as to hermetically seal an opening of the lower end of the reaction tube 203, that is, the opening of the manifold 226. The seal cap 219 is made of metal such as a nickel alloy or stainless steel, and is formed in a disc shape. The seal cap 219 may be configured to cover its outside with a heat resistant material such as quartz ($SiO_2$) or silicon carbide (SiC).

A boat supporting base 218 for supporting the boat 217 is installed on the seal cap 219. The boat supporting base 218 is made of a heat resistant material such as quartz or silicon carbide. The boat supporting base 218 functions as a heat insulator and also serves as a support body for supporting the boat. The boat 217 is erected on the boat supporting base 218. The boat 217 is made of a heat resistant material such as quartz or silicon carbide. Although not shown, the boat 217 has a bottom plate fixed to the boat support, a ceiling plate disposed above the bottom plate, and a plurality of posts installed between the bottom plate and the ceiling plate. The wafers 200 are held in the boat 217. The wafers 200 are stacked in multiple stages in the tubular axis direction of the reaction tube 203 in such a state that the wafers 200 are arranged in a horizontal posture with the wafers 200 spaced apart by a certain distance from one another and with the centers of the wafers 200 aligned with one another, and are supported by the posts of the boat 217.

On the opposite side of the seal cap 219 from the process chamber 201 is installed a boat rotation mechanism 267 for rotating the boat. A rotary shaft 265 of the boat rotation mechanism 267, which penetrates through the seal cap, is connected to the boat support 218. The boat rotation mechanism 267 rotates the wafers 200 by rotating the boat 217 via the boat supporting base 218.

The seal cap 219 is vertically moved up and down by a boat elevator 115 which is an elevator mechanism installed outside the reaction tube 203, thereby allowing the boat 217 to be loaded and unloaded into and from the process chamber 201.

In the manifold 226, nozzle supports 350a to 350c for supporting the nozzles 340a to 340c are bent in an L shape so as to penetrate the manifold 226. In this example, three nozzle supports 350a to 350c are installed. The nozzle supports 350a to 350c are made of a material such as a nickel alloy or stainless steel. Gas supply pipes 310a to 310c for supplying gases into the reaction tube 203 are respectively connected to one ends of the nozzle supports 350 on the side of the reaction tube 203. The nozzles 340a to 340c are respectively connected to the other ends of the nozzle supports 350a to 350c. The nozzles 340a to 340c are made of a heat resistant material such as quartz or SiC.

The nozzles 340a to 340c are installed from the lower part to the upper part of the gas supply area 222 along its lengthwise direction (vertical direction). The nozzles 340a to 340c are configured as I-shaped long nozzles, respectively. Gas supply holes 232a to 232c for supplying gases are formed in the side surfaces of the nozzles 340a to 340c, respectively. The gas supply holes 232a to 232c are opened so as to face the center of the reaction tube 203. In this manner, the three nozzles 340a to 340c are installed in the gas supply area 222 so as to supply a plurality of types of gases into the process chamber 201.

In the above-described processing furnace 202, in a state where the wafers 200 are stacked on the boat 217 in multiple stages, the boat 217 is inserted into the process chamber 201 while being supported by the boat support base 218, and the heater 207 heats the wafers 200 inserted into the process chamber 201 to a predetermined temperature.

A first processing gas supply source 360a for supplying a first processing gas, a mass flow controller (MFC) 241a, which is a flow rate controller (flow rate control part), and a valve 243a, which is an opening/closing valve, are installed in the gas supply pipe 310a sequentially from the upstream side. A second processing gas supply source 360b for supplying a second processing gas, a mass flow controller (MFC) 241b, which is a flow rate controller (flow rate control part), and a valve 243b, which is an opening/closing valve, are installed in the gas supply pipe 310b sequentially from the upstream side. A third processing gas supply source 360c for supplying a third processing gas, a mass flow controller (MFC) 241c, which is a flow rate controller (flow rate control part), and a valve 243c, which is an opening/closing valve, are installed in the gas supply pipe 310c sequentially from the upstream side. Gas supply pipes 310d to 310f for supplying an inert gas are respectively connected to the gas supply pipes 310a to 310c at the downstream side of the valves 243a to 243c. MFCs 241d to 241f, which are flow rate controllers (flow rate control parts), and valves 243d to 243f, are respectively installed in the gas supply pipes 310d to 310f sequentially from the upstream sides.

A first processing gas supply system is mainly constituted by the gas supply pipe 310a, the MFC 320a and the valve 330a. The first processing gas supply source 360a, the nozzle support 350a and the nozzle 340a may be included in the first processing gas supply system. A second processing gas supply system is mainly constituted by the gas supply pipe 310b, the MFC 320b and the valve 330b. The second processing gas supply source 360b, the nozzle support 350b and the nozzle 340b may be included in the second processing gas supply system. A third processing gas supply system is mainly constituted by the gas supply pipe 310c, the MFC 320c and the valve 330c. The third processing gas supply source 360c, the nozzle support 350c and the nozzle 340c may be included in the third processing gas supply system. When the term "processing gas" is used herein, it may indicate a case of including only the first processing gas, a case of including only the second processing gas, a case of including only the third processing gas, or a case of including all of them. When the term "processing gas supply system" is used herein, it may indicate a case of including only the first processing gas supply system, a case of including only the second processing gas supply system, a case of including only the third processing gas supply system, or a case of including all of them.

An exhaust port 230 is formed in the lower part of the gas exhaust area 224. The exhaust port 230 is connected to an exhaust pipe 231. A vacuum exhaust device, e.g., a vacuum pump 246, is connected to the exhaust pipe 232 via a pressure sensor 245, which is a pressure detector (pressure detecting part) for detecting an internal pressure of the process chamber 201, and an auto pressure controller (APC) valve 244, which is a pressure regulator (pressure regulating part), so that the internal pressure of the process chamber 201 can be vacuum-exhausted to a predetermined pressure (degree of vacuum). The exhaust pipe 232 in the downstream side of the vacuum pump 246 is connected to a waste gas processing device (not shown) or the like. The APC valve 244 is an opening/closing valve configured to perform or stop vacuum exhaust in the process chamber 201 by opening or closing the valve and regulate the internal pressure of the process chamber 201 by regulating an opening degree of the valve to adjust its conductance. An exhaust system is mainly constituted by the exhaust pipe 232, the APC valve 244 and the pressure sensor 245. The vacuum pump 246 may be included in the exhaust system.

A temperature sensor 238 (which will be described later) as a temperature detector is installed in the reaction tube 203. The internal temperature of the process chamber 201 can have a desired temperature distribution by adjusting power supplied to the heater 207 based on temperature information detected by the temperature sensor 238.

Figure 3:
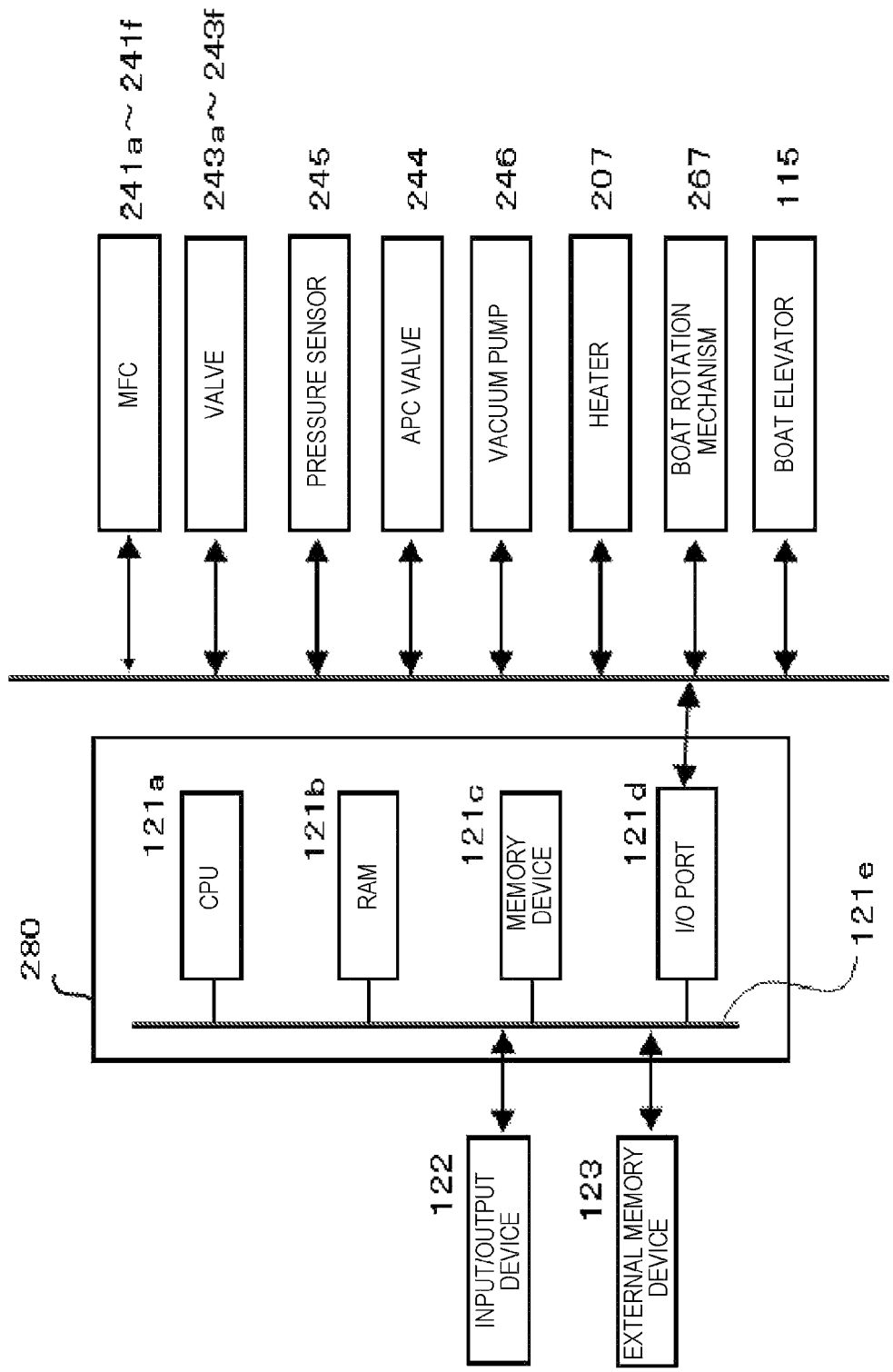
FIG. 3 is a schematic configuration view of a controller of the substrate processing apparatus suitably used in the embodiment of the present disclosure, in which a control system of the controller is shown in a block diagram.

As illustrated in FIG. 3, a controller 280, which is a control part (control unit), may be configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 280.

The memory device 121c is configured with, for example, a flash memory, a hard disk drive (HDD) or the like. A control program for controlling operations of a substrate processing apparatus and a process recipe, in which sequences and conditions of a film forming process to be described later are written, are readably stored in the memory device 121c. The process recipe functions as a program and is configured to cause the controller 280 to execute each sequence in the substrate processing process, which will be described later, to obtain a predetermined result. Hereinafter, the process recipe and the control program will be generally and simply referred to as a "program". When the term "program" is used herein, it may indicate a case of including only the process recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the heater 207, the temperature sensor 238, the boat rotation mechanism 267, the boat elevator 115, and so on.

The CPU 121a is configured to read and execute the control program from the memory device 121c. The CPU 121a also reads the process recipe from the memory device 121c according to an input of an operation command from the input/output device 122. The CPU 121a is configured to control the flow rate adjusting operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 238, the operation of rotating the boat 217 with the rotation mechanism 267 and adjusting the rotation speed of the boat 217, the operation of moving the boat 217 up and down with the boat elevator 115, and so on, according to contents of the read process recipe.

The controller 280 may be configured by a general-purpose computer as well as a dedicated computer. For example, the controller 280 of this embodiment may be configured by installing, on the general-purpose computer, the aforementioned program stored in an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card). However, the program may be supplied to the computer using communication means such as the Internet or a dedicated line, instead of using the external memory device 123. The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123.

Next, the shape of the reaction tube 203 suitably used in the first embodiment will be described with reference to FIGS. 2, 4 and 5.

Figure 2:
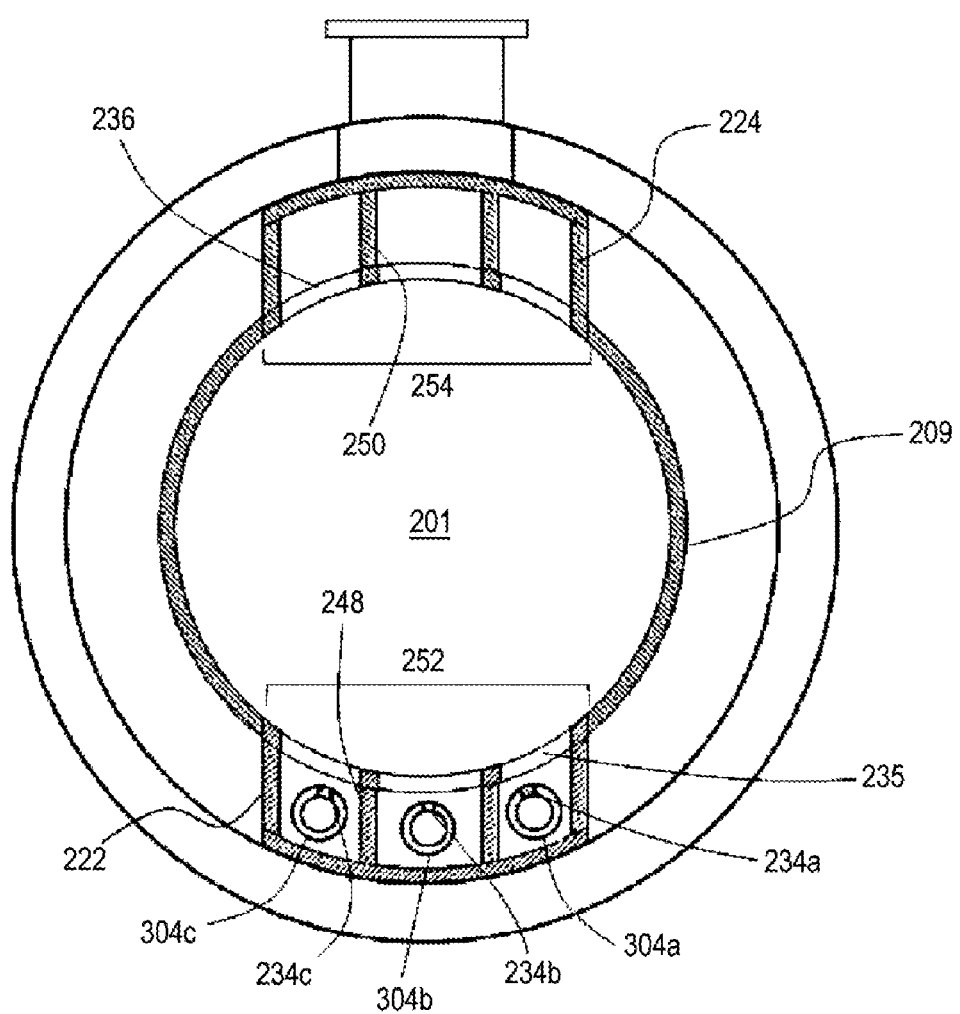
FIG. 2 is a schematic partial configuration view of the vertical processing furnace of the substrate processing apparatus suitably used in the embodiment of the present disclosure, in which a reaction tube is shown in a cross section.

As shown in FIG. 2, inside the gas supply area 222 and the gas exhaust area 224 are respectively formed inner walls 248 and 250 to partition their respective interiors into a plurality of spaces.

The inner walls 248 and 250 are made of the same material as the reaction tube 203, for example, a heat resistant material such as quartz ($SiO_2$) or silicon carbide (SiC), for example.

In this embodiment, each of the gas supply area 222 and the gas exhaust area 224 has two inner walls and is partitioned into three spaces.

The two inner walls 248 partitioning the interior of the gas supply area 222 are provided so as to partition the gas supply area 222 from its lower end side to its upper end side to form three isolated spaces. The nozzles 340a to 340c are respectively installed in the three spaces of the gas supply area 222. Since each of the nozzles 340a to 340c is installed in an independent space, it is possible to prevent processing gases supplied from the nozzles 340a to 340c from being mixed in the gas supply area 222 by the inner walls 248.

With such a configuration, it is possible to prevent a thin film or by-products from being formed by mixture of the processing gases in the gas supply area 222.

Preferably, the inner walls 248 may be formed so as to partition the gas supply area 222 from its lower end to its upper end to form three isolated spaces.

The two inner walls 250 partitioning the interior of the gas exhaust area 224 are provided so as to partition the gas exhaust area 224 from its lower end side to its upper end side to form three isolated spaces.

Preferably, the inner walls 250 are formed so as to partition the gas exhaust area 224 from its lower end side to its upper end side to form three isolated spaces.

Preferably, when the outer diameters of the outer walls of the gas supply area 222 and the gas exhaust area 224 have the same dimension, there is a merit that a dead space between each area and the heater 207 can be reduced.

In addition, preferably, the gas flow passages of the gas supply area 222 and the gas exhaust area 224 have the same sectional areas. In addition, preferably, the gas flow passage sectional area of each space in the gas supply area 222 is equal to and the gas flow passage sectional area of each space in the gas exhaust area 224 facing each space in the gas supply area 222.

Figure 4:
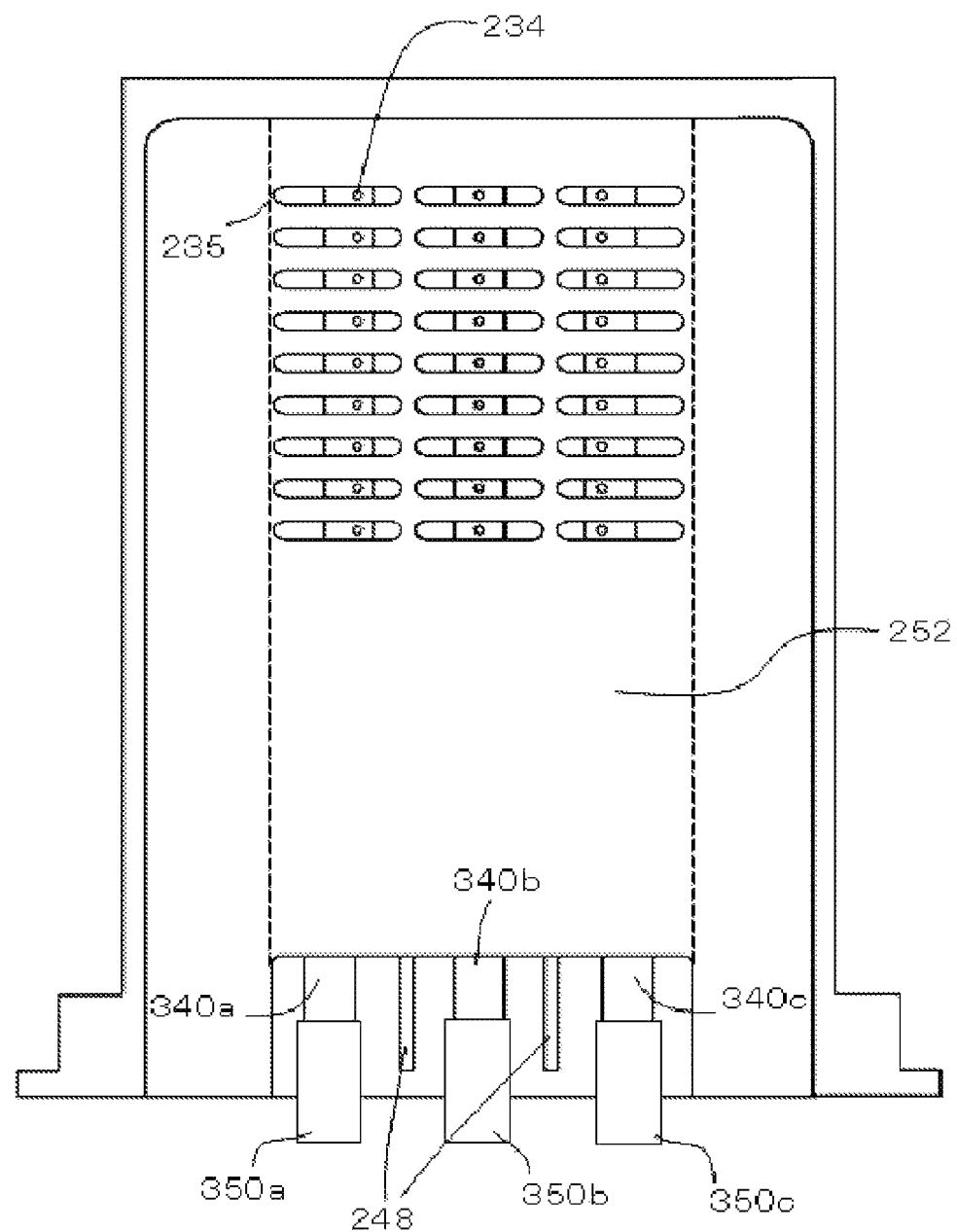
FIG. 4 is a schematic partial configuration view of the vertical processing furnace of the substrate processing apparatus suitably used in the embodiment of the present disclosure, in which the reaction tube is shown in a longitudinal section.

As shown in FIG. 4, an opening 256 for installing the nozzles 340a to 340c in the gas supply area 222 is formed at the lower end of the boundary wall 252 of the cylindrical portion 209 on the side of the gas supply area 222. When installing the nozzles 340a to 340c, the nozzles 340a to 340c are inserted into the respective spaces from the opening 256, the lower ends of the nozzles 340a to 340c are firstly lifted high from the upper ends of the nozzle supports 350a to 350c and, after that, the lower ends of the nozzles 340a to 340c are inserted by positioning the lower ends of the nozzles 340a to 340c lower than the upper ends of the nozzle supports 350a to 350c.

Figure 5:
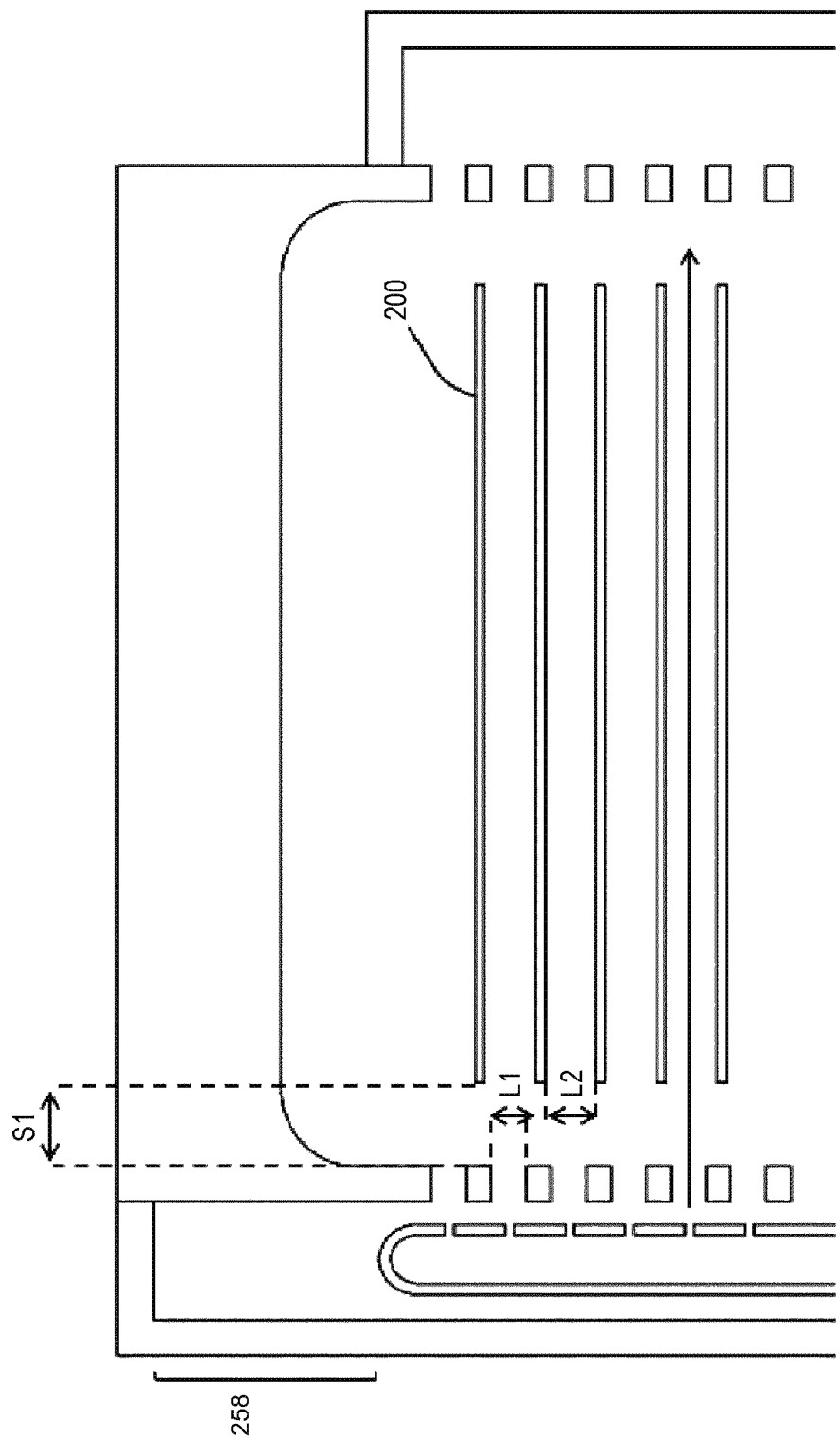
FIG. 5 is a schematic partial configuration view of the vertical processing furnace of the substrate processing apparatus suitably used in the embodiment of the present disclosure, in which an upper portion of the reaction tube is shown by enlargement.

When lifting up and installing the nozzles 340a to 340c into the nozzle supports 350a to 350c, in order to prevent the upper ends of the nozzles 340a to 340c from coming in contact with the ceiling portion at the upper end of the gas supply area 222, a buffer region 258 is formed above the upper ends of the nozzles 340a to 340c of the gas supply area 222 (see FIG. 5). The upper end side of the gas supply area 222 is configured to be higher than the ceiling portion of the gas exhaust area 224 by at least the buffer region 258.

In this embodiment, the upper end of the ceiling portion of the gas supply area 222 has the same height as the upper end of the ceiling portion of the cylindrical portion 209, and the upper end of the ceiling portion of the gas exhaust area 224 is lower than the upper end of the ceiling portion of the cylindrical portion 209.

In other words, the volume of the gas supply area 222 is larger than the volume of the gas exhaust area 224 by the amount of the buffer region 258. Although the upper end of the gas exhaust area 224 is lower than the upper end of the gas supply area 222 in this embodiment, the upper end of the gas exhaust area 224 may have the same height as the upper end of the gas supply area 222 as long as there is no problem such as an influence of the size of the volume of the gas exhaust area 224 on an exhaust balance and on the condition of adhesion of by-products.

The inner walls 250 in the gas exhaust area 224 are formed from the upper end of the ceiling portion of the gas exhaust area 224 to a position higher than the upper end of the exhaust port 230 on the lower end side of the gas exhaust area 224. A portion from the position higher than the upper end of the exhaust port 230 at the lower end side of the gas exhaust area 224 to the lower end of the gas exhaust area 224 is configured as one space.

Gases flowed through the spaces partitioned by the inner walls 250 of the gas exhaust area 224 join in one space right before the exhaust port 230 and are exhausted from the exhaust port 230.

The inner walls 248 in the gas supply area 222 is formed from the ceiling portion of the gas supply area 222 to the top of the lower end portion of the reaction tube 203. Specifically, the lower ends of the inner walls 248 are formed to be lower than the upper end of the opening 256. The lower ends of the inner walls 248 are formed as regions above the lower end portion of the reaction tube 203 and below the upper end portion of the nozzle supports 350. The length of the inner walls 248 in the gas supply area 222 is smaller than the length of the reaction tube 203 and larger than the length of the boundary wall 252. In addition, the inner walls 248 in the gas supply area 222 are longer than the inner walls 250 in the gas exhaust area 224.

As shown in FIG. 4, the gas supply slits 235 for supplying a processing gas into the process chamber 201 is formed in the boundary wall 252 between the cylindrical portion 209 and the gas supply area 222. The gas supply slits 235 are formed in the shape of a matrix of a plurality of stages and a plurality of rows in the vertical and horizontal directions. That is, a plurality of horizontally long slits facing the respective spaces partitioned by the inner walls 248 in the gas supply area 222 is formed in the vertical direction.

Preferably, when the length of the gas supply slits 235 in the circumferential direction of the cylindrical portion 209 is equal to the circumferential length of each space in the gas supply area 222, gas supply efficiency may be improved. In addition, preferably, when the gas supply slits 235 are formed to have a plurality of longitudinal stages extending horizontally except for a connecting portion between the inner walls 248 and the boundary wall 252, the gas supply efficiency may be improved. In addition, preferably, the number of rows of the gas supply slits 235 may be equal to the number of partitioned spaces. In this embodiment, since three spaces are formed, three rows of gas supply slits 235 are formed.

The gas exhaust slits 236 for exhausting the internal atmosphere of the process chamber 201 are formed in the boundary wall 254 between the cylindrical portion 209 and the gas exhaust area 224. The gas exhaust slits 236 are formed in the shape of a matrix of a plurality of stages and a plurality of rows in the vertical and horizontal directions. That is, a plurality of horizontally elongated slits, which are opposed to the respective spaces defined by the inner walls 248 in the gas supply area 222 and elongated in the circumferential direction of the cylindrical portion, is formed in the vertical direction.

Preferably, when the length of the gas exhaust slits 236 in the circumferential direction of the cylindrical portion 209 is equal to the circumferential length of each space in the gas exhaust area 224, gas exhaust efficiency may be improved. In addition, preferably, when the gas exhaust slits 236 are formed in a plurality of longitudinal stages extending horizontally except for a connecting portion between the inner walls 250 and the boundary wall 254, the gas exhaust efficiency may be improved. In addition, preferably, the number of rows of the gas exhaust slits 236 may be equal to the number of partitioned spaces. In this embodiment, since three spaces are formed, three rows of gas exhaust slits 236 are formed.

The gas supply slits 235 and the gas exhaust slits 236 are smoothly formed so that the edge portions as the four corners of each of them are curved. It is possible to suppress the stagnation of a gas around the edge portion by rounding (R) the edge portions into a curved shape. As a result, it is possible to suppress formation of a film at the edge portions and further prevent a film formed at the edge portions from being peeled.

As shown in FIG. 5, the gas supply slits 235 and the gas exhaust slits 236 are interposed between adjacent wafers 200 mounted in multiple stages on the boat 217 (not shown in FIG. 5) accommodated in the process chamber 201.

Preferably, from between the lowermost wafer 200 that can be mounted on the boat 217 and an adjacent wafer 200 immediately above the lowermost wafer 200 to between the uppermost wafer 200 and the ceiling plate of the boat 217 that is adjacent to the uppermost wafer 200, the gas supply slits 235 and the gas exhaust slits 236 may be formed, by one stage, between the wafers and between the uppermost wafer 200 and the ceiling plate, while opposing each other.

Preferably, the gas supply slits 235 and the gas exhaust slits 236 may be formed to have the same height and the same number. For example, when 25 wafers 200 are mounted, 25 stages of gas supply slits 235 and gas exhaust slits 236 may be formed.

Preferably, the gas supply slits 235 and the gas exhaust slits 236 may be formed with a certain vertical width (L1). Assuming that a gap between adjacent wafers 200 is L2, the gas supply slits 235 and the gas exhaust slits 236 may be formed such that L1 is smaller than L2. This configuration can suppress the stagnation of a gas flowing from the gas supply slits 235 to the wafers 200 and further prevent a gas flowing from the process chamber 201 to the gas exhaust slits 236 from being stagnated.

Preferably, L1 may be set to fall within a range of about 1 to 9 mm, specifically about 3 to 7 mm. In addition, L2 may be set to fall within a range of about 6 to 14 mm, specifically about 8 to 12 mm.

The gas supply holes 234a to 234c of the nozzles 340a to 340c may be formed at the central portion of the vertical width of the gas supply slits 235 so as to make one-to-one correspondence to the gas supply slits 235. For example, when 25 gas supply slits 235 are formed, 25 gas supply holes 234a to 234c may be formed. That is, the gas supply slits 235 and the gas supply holes 234a to 234c may be formed in the same number as the mounted wafers 200. By adopting such a slit configuration, it is possible to form a flow of processing gas parallel to the wafers 200 on the wafers 200 (see an arrow in FIG. 5).

In addition, since the slits are formed to be long in the gas exhaust area 224 in the circumferential direction, exhaust can be performed without disturbing a flow of processing gas flowing onto the wafers 200. For example, when the gas exhaust slits are formed in a hole shape, the flow of processing gas is concentrated toward the holes and, therefore, it is not possible to form a uniform gas flow on the wafers 200. On the other hand, in this embodiment, since the gas exhaust slits are formed to be long in the horizontal direction, without a flow of processing gas which is more concentrated as it gets closer to the exhaust side, the flow can be rectified on the wafers 200, thereby supplying the processing gas in a uniform manner.

Next, an outline of operation of the substrate processing apparatus according to the present disclosure will be described. The substrate processing apparatus is controlled by the controller 280.

The boat 217 on which a predetermined number of wafers 200 are mounted is inserted into the reaction tube 203, and the reaction tube 203 is hermetically sealed by the seal cap 219. In the hermetically-sealed reaction tube 203, a processing gas is supplied into the reaction tube 203 while the wafers 200 are heated to subject the wafers 200 to heat treatment.

As the heat treatment, for example, an $NH_3$ gas as the first processing gas, an HCDS gas as the second processing gas and an $N_2$ gas as the third processing gas are alternately supplied (i.e., one cycle including HCDS gas supply→$N_2$ gas purge→$NH_3$ gas supply→$N_2$ purge is repeated a predetermined number of times) to form an SiN film on each of the wafers 200. The processing conditions are, for example, as follows.

Temperature of wafer 200: 100 to 600 degrees C.
Internal pressure of process chamber: 1 to 3,000 Pa
HCDS gas supply flow rate: 1 to 2,000 sccm
$NH_3$ gas supply flow rate: 100 to 10,000 sccm
$N_2$ gas supply flow rate: 10 to 10,000 sccm
Film thickness of SiN film: 0.2 to 10 nm First, the HCDS gas is supplied from the gas supply pipe 310b of the second processing gas supply system into the process chamber 201 via the gas supply holes 234b of the nozzle 304b and the gas supply slits 235. Specifically, the valves 330b and 330e are opened to start supply of the HCDS gas from the gas supply pipe 310b into the process chamber 201 along with a carrier gas. At this time, the opening degree of the APC valve 244 is adjusted to maintain the internal pressure of the process chamber 201 at a predetermined pressure. When a predetermined time has elapsed, the valve 330b is closed to stop the supply of the HCDS gas.

The HCDS gas supplied into the process chamber 201 is supplied to the wafers 200 and flows in parallel on the wafers 200. Then, the HCDS gas flows from the upper part to the lower part of the gas exhaust area 224 through the gas exhaust slits 236 and is exhausted from the exhaust pipe 232 through the exhaust port 230 below the gas exhaust area 224.

While the HCDS gas is being supplied into the process chamber 201, when an inert gas such as $N_2$ is flowed by opening the valves 330a and 330c of the inert gas supply pipe connected to the gas supply pipes 310a and 310c, it is possible to prevent the HCDS gas from going into the gas supply pipes 310a and 310c.

After closing the valve 330b to stop the supply of the HCDS gas into the process chamber 201, the APC valve 244 is opened to exhaust the interior of the process chamber 201 to exhaust the HCDS gas and reaction products remaining in the process chamber 201. At this time, when the inert gas such as $N_2$ is supplied from the inert gas supply pipes 310a and 310c into the process chamber 201 for purge, the effect of exhaustion of the residual gas from the interior of the process chamber 201 can be further enhanced. After the lapse of a predetermined time, the valve 330e is closed.

Next, the $NH_3$ gas is supplied from the gas supply pipe 310a of the first processing gas supply system into the process chamber 201 via the gas supply holes 234a of the nozzle 304a and the gas supply slits 235. Specifically, the valves 330a and 330d are opened to start supply of the $NH_3$ gas from the gas supply pipe 310a into the process chamber 201 along with a carrier gas. At this time, the opening degree of the APC valve 244 is adjusted to maintain the internal pressure of the process chamber 201 at a predetermined pressure. When a predetermined time has elapsed, the valve 330a is closed to stop the supply of the $NH_3$ gas.

The $NH_3$ gas supplied into the process chamber 201 is supplied to the wafers 200 and flows in parallel on the wafers 200. Then, the $NH_3$ gas flows from the upper part to the lower part of the gas exhaust area 224 through the gas exhaust slits 236 and is exhausted from the exhaust pipe 232 through the exhaust port 230 below the gas exhaust area 224.

While the $NH_3$ gas is supplied into the process chamber 201, when an inert gas such as $N_2$ is flowed by opening the valves 330e and 330f of the inert gas supply pipe connected to the gas supply pipes 310b and 310c, it is possible to prevent the $NH_3$ gas from going back into the gas supply pipes 310a and 310c.

After closing the valve 330a to stop the supply of the $NH_3$ gas into the process chamber 201, the APC valve 244 is opened to exhaust the interior of the process chamber 201 to exclude the $NH_3$ gas and reaction products remaining in the process chamber 201. At this time, when the inert gas such as $N_2$ is supplied from the inert gas supply pipes 310e and 310f into the process chamber 201 for purge, the effect of exclusion of the residual gas from the interior of the process chamber 201 can be further enhanced. After the lapse of a predetermined time, the valve 330e is closed.

Upon completion of the processing of the wafers 200, the boat 217 is unloaded from the reaction tube 203 according to a procedure reverse to the above operation. The wafers 200 are transferred from the boat 217 to a cassette of a transfer shelf by a wafer transfer device. The cassette is transferred from the transfer shelf to a cassette stage by a cassette transfer device, and is unloaded to the outside of a housing by an external transfer device (not shown).

In the above-described embodiment, the case where the first processing gas and the second processing gas are alternately supplied has been described, but the present disclosure may be also applied to a case where the first processing gas and the second processing gas are supplied at the same time.

As shown in FIG. 8, in a case of supplying a processing gas according to a conventional reaction tube configuration, the processing gas is conically supplied from gas supply holes over an upper, lower, left and right directions. Since the processing gas is widely supplied not only in the direction parallel to the wafers 200 (left and right direction) but also in the vertical direction, the processing gas flows into a space between the edges of the wafers 200 and the reaction tube and, therefore, a sufficient amount of processing gas cannot be supplied between the wafers 200. Therefore, a film near the gas supply holes becomes thick, which results in difficulty in obtaining uniform film thickness. In addition, replacement efficiency of the processing gas is poor and the productivity is deteriorated.

On the other hand, as shown in FIG. 9, in this embodiment, the horizontally elongated gas supply slits 235 are formed in the downstream side of the gas supply holes. Since the processing gas supplied in the vertical direction strikes on the boundary wall 252, it is not directly supplied into the process chamber 201. The processing gas striking on the boundary wall 252 is diffused in the gas supply area 222 and is horizontally (in left and right directions) spread into the process chamber 201 along the shape of the gas supply slits 235. Since the vertical width of the gas supply slits 235 is shorter than the gap between the wafers 200, even when the processing gas having passed through the gas supply slits 235 is spread somewhat in the vertical direction, the processing gas does not flow into a space between the edges of the wafers 200 and the reaction tube, so that a sufficient amount of processing gas can be supplied between the wafers 200, thereby reducing deviation in film thickness.

In this embodiment, the gas supply area 222 and the gas exhaust area 224 are formed outside the cylindrical portion 209 (the process chamber 201). With such a configuration, it is possible to make the volume of the reaction tube 203 smaller than that of a conventional reaction tube. Assuming that a gap between the cylindrical portion 209 and the edges of the wafers 200 is S1 (see FIG. 5), it is possible to reduce the volume by about 30% compared with the conventional reaction tube, improving the productivity.

In the above-described embodiment, the gas supply area 222 and the gas exhaust area 224 are respectively partitioned into three spaces, but they may be partitioned into two, four or more spaces. The number of spaces to be partitioned may be appropriately changed according to the number of nozzles required for desired heat treatment.

Further, the shape of the nozzles may be changed. For example, the gas supply hole of a nozzle installed in the middle space may be opened toward the inner walls. By opening the gas supply port not to the wafers 200 but to the inner walls, the processing gas can be diffused in the space, thereby uniformly supplying the processing gas from the gas supply slits.

(3) Effects According to the Present Embodiment

According to the present embodiment, one or more effects set forth below can be achieved.

(a) Since the gas supply area and the gas exhaust area are formed outside the process chamber, there is no need to install a nozzle as a gas supply medium for supplying gas to the process chamber. Therefore, it is possible to shorten a gap between the edges of the substrates and the inner wall of the reaction tube and make the volume of the reaction tube significantly smaller than that of the conventional reaction tube. Accordingly, it is possible to prevent a processing gas from being flown from the gap between the edges of the wafers and the inner wall of the reaction tube so as to supply a sufficient amount of processing gas between the substrates, thereby improving the replacement efficiency of the processing gas.

(b) By forming the inner walls in the supply buffer area and the exhaust buffer area, it is possible to compensate for decrease in strength of the reaction tube, which is caused by forming the gas supply area and the gas exhaust area outside the process chamber. Accordingly, it is possible to reduce the risk of breakage of the reaction tube while reducing the volume of the reaction tube.

(c) By smoothly forming the edge portions of the gas supply slits and the gas exhaust slits so as to form a curved surface, it is possible to suppress the stagnation of a gas around the edge portions, thereby suppressing formation of a film at the edge portions and further preventing a film formed at the edge portions from being peeled.

(d) Since the nozzles are installed in the spaces isolated from each other by the inner walls inside the gas supply area, it is possible to prevent processing gases supplied from the nozzles from being mixed in the gas supply area. With this configuration, it is possible to prevent the processing gases from being mixed in the gas supply area to form a thin film or to generate by-products and it is possible to suppress a decrease in yield due to particle generation. Further, since a flow velocity of a processing gas can be reduced in each space, it is possible to promote uniform supply of the processing gas into the process chamber without causing a sudden change in flow velocity of the processing gas, thereby improving the productivity.

(e) Since a buffer region is formed above the upper ends of the nozzles in the gas supply area, it is possible to safely perform nozzle replacement.

Next, a second embodiment of the present disclosure will be described. This embodiment is different from the first embodiment in that temperature measurement areas 260 are formed at both ends of the gas exhaust area 224 in order to install the temperature sensor 238 in the gas exhaust area. Hereinafter, the shape of the reaction tube 203 suitably used in the second embodiment will be described with reference to FIG. 6. Explanation of the same configuration as in the first embodiment will not be repeated.

Figure 6:
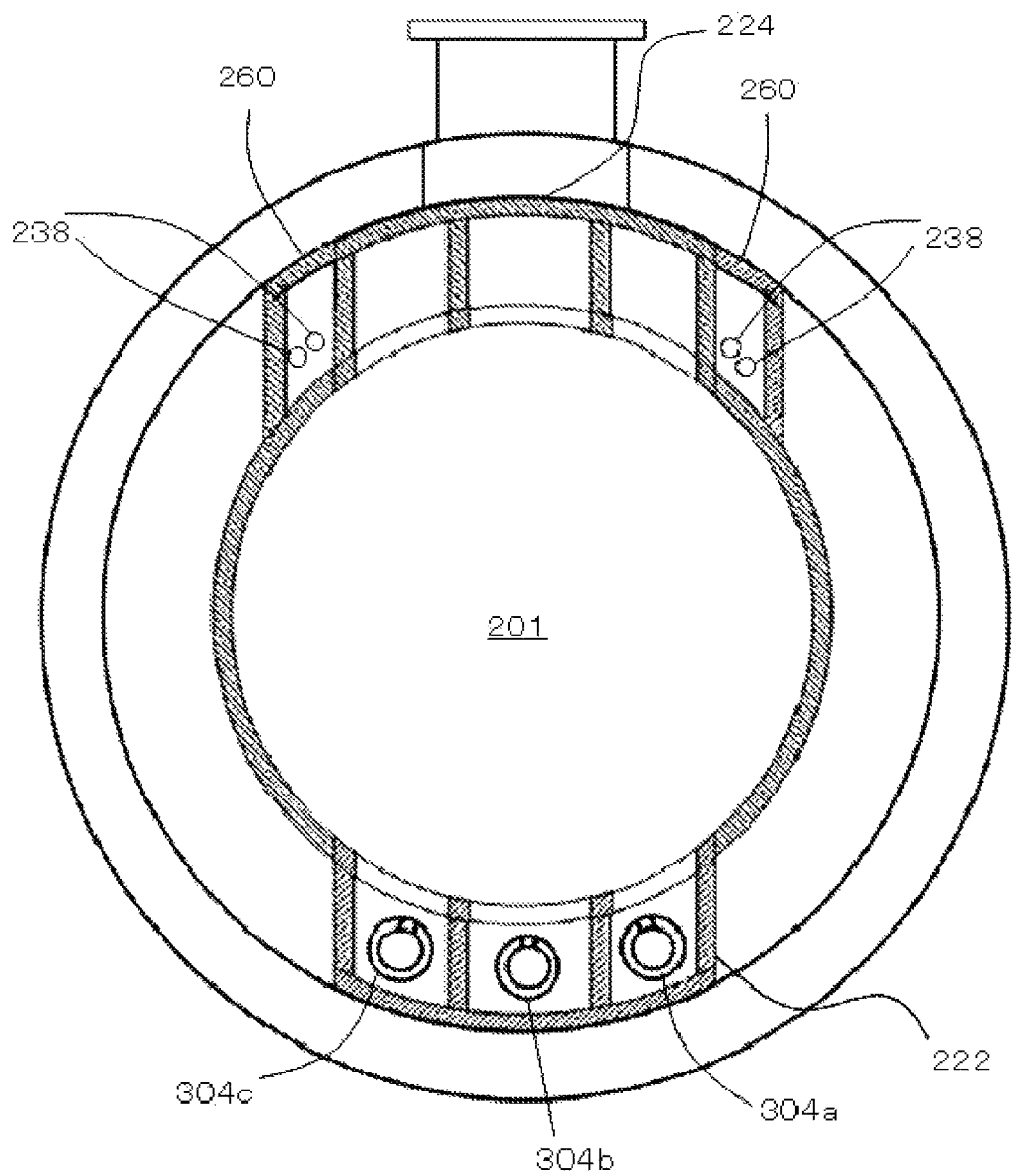
FIG. 6 is a cross-sectional view of a reaction tube suitably used in a second embodiment of the present disclosure.

As shown in FIG. 6, the temperature measurement area 260 in which the temperature sensor 238 is accommodated is formed at both ends of the gas exhaust area 224. The temperature measurement area 260 is formed in the shape of having a ceiling in which its lower end portion and upper end portion are closed to form a flat shape, and the outer wall thereof is formed in a concentric relationship with the cylindrical portion 209. In addition, the temperature measurement area 260 is continuously formed via the gas exhaust area 224 and the inner walls 250. A gas exhaust slit 236 is not formed in a boundary wall between the temperature measurement area 260 and the cylindrical portion 209.

That is, the temperature measurement area 260 is spatially independent from the gas exhaust area 224 and the process chamber 201. With this configuration, it is possible to prevent the temperature sensor 238 from being exposed to a processing gas, thereby suppressing deterioration of the temperature sensor 238.

Figure 7:
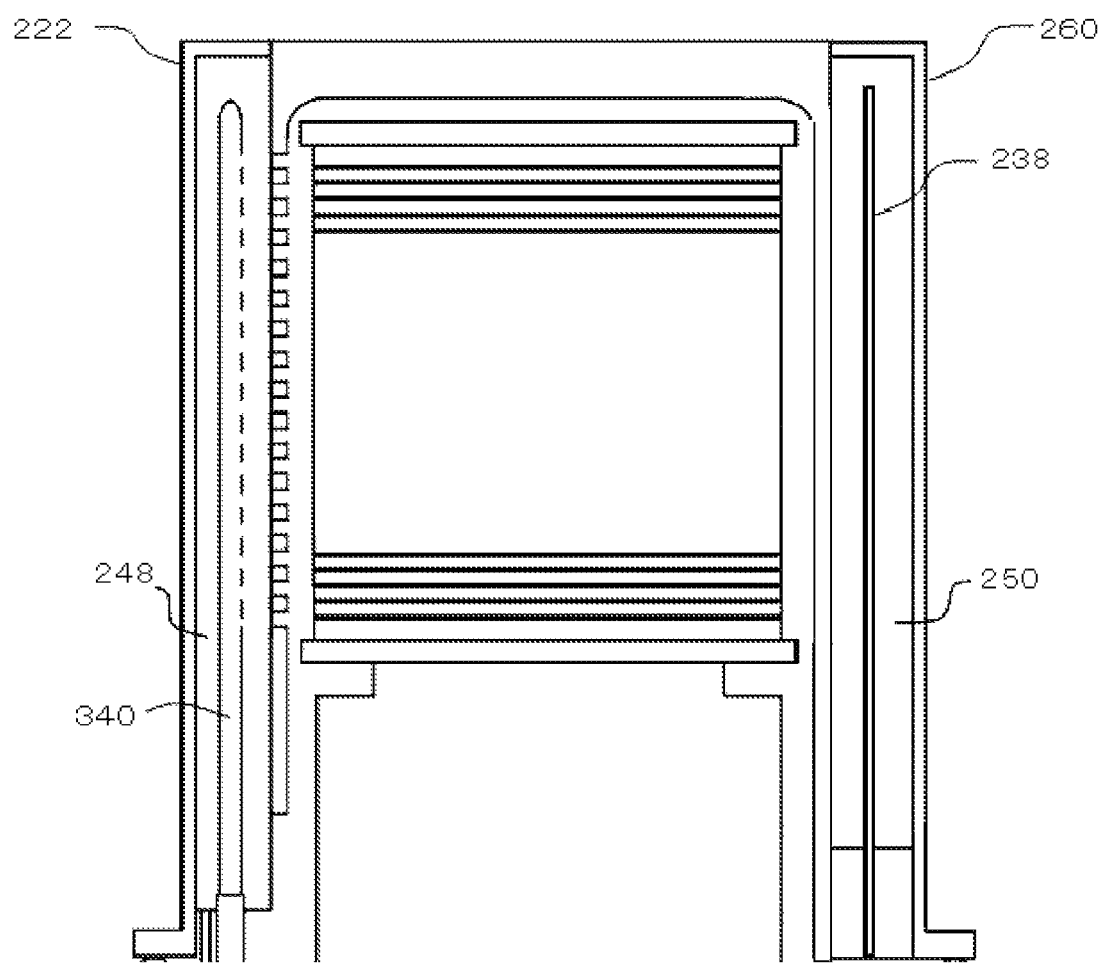
FIG. 7 is a longitudinal sectional view of the reaction tube suitably used in the second embodiment of the present disclosure.

As shown in FIG. 7, in order to measure the internal temperature of the process chamber 201 above the uppermost wafer 200 mounted on the boat 217 by the temperature sensor 238, the height of the ceiling portion of the temperature measurement area 260 is set to be equal to the height of the cylindrical portion 209. Similarly, the ceiling portion of the gas exhaust area 224 is formed to have the same height as the cylindrical portion 209. That is, in this embodiment, the ceiling portions of the gas supply area 222, the gas exhaust area 224, the temperature measurement area 260 and the cylindrical portion 209 are formed so as to be flat at the same height. With this configuration, it is possible to measure the internal temperature of the process chamber 201 in the vertical direction, thereby allowing the heater 207 to uniformly heat in the interior of the process chamber 201. In addition, it is possible to increase the strength of the reaction tube 203. Further, by forming the temperature measurement area 260 at both ends of the gas exhaust area 224, it is possible to improve maintenance.

The film forming process performed in the substrate processing apparatus includes, for example, CVD, PVD, ALD, Epi, a process of forming an oxide film or a nitride film, a process of forming a film containing metal, etc. Furthermore, the film forming process may include annealing treatment, oxidation treatment, diffusion treatment and the like.

ASPECTS OF THE PRESENT DISCLOSURE

Hereinafter, some aspects of the present disclosure will be additionally stated.

(Supplementary Note 1)

There is provided a substrate processing apparatus including: a substrate holding member configured to hold a plurality of substrates; a reaction tube configured to accommodate the substrate holding member and process the substrates; a processing gas supply system configured to supply a processing gas into the reaction tube; and an exhaust system configured to exhaust an internal atmosphere of the reaction tube, wherein the reaction tube includes: a cylindrical portion with its upper end closed and its lower end opened; a gas supply area which is formed outside one side wall of the cylindrical portion and to which the processing gas supply system is connected; and a gas exhaust area which is formed outside the other side wall of the cylindrical portion opposed to the gas supply area and to which the exhaust system is connected, and wherein each of the gas supply area and the gas exhaust area has an inner wall which partitions the interior of each of the gas supply area and the gas exhaust area into a plurality of spaces.

(Supplementary Note 2)

In the substrate processing apparatus according to Supplementary Note 1, a gas supply slit for supplying the processing gas into the cylindrical portion may be formed at a boundary wall between the gas supply area and the cylindrical portion.

(Supplementary Note 3)

In the substrate processing apparatus according to Supplementary Note 1 or 2, a gas exhaust slit for exhausting the internal atmosphere of the cylindrical portion may be formed at a boundary wall between the gas exhaust area and the cylindrical portion.

(Supplementary Note 4)

In the substrate processing apparatus according to Supplementary Note 3, the gas supply slit and the gas exhaust slit may be formed in plural in a vertical direction at positions facing the plurality of spaces.

(Supplementary Note 5)

In the substrate processing apparatus according to Supplementary Note 3 or 4, the gas supply slit and the gas exhaust slit may be formed to be long in the circumferential direction of the cylindrical portion, and both ends of the gas supply slit and the gas exhaust slit may be formed in a curved shape.

(Supplementary Note 6)

In the substrate processing apparatus according to any one of Supplementary Notes 1 to 5, the cross sectional area of the gas supply area may be equal to the cross sectional area of the gas exhaust area.

(Supplementary Note 7)

In the substrate processing apparatus according to any one of Supplementary Notes 1 to 6, the gas supply area and the gas exhaust area may have the same number of inner walls and may be partitioned into the same number of spaces.

(Supplementary Note 8)

In the substrate processing apparatus according to Supplementary Note 6 or 7, the cross sectional area of each space of the gas supply area may be equal to the cross sectional area of each space of the gas exhaust area facing each space of the gas supply area.

(Supplementary Note 9)

In the substrate processing apparatus according to any one of Supplementary Notes 1 or 8, the volume of the gas supply area may be larger than the volume of the gas exhaust area.

(Supplementary Note 10)

In the substrate processing apparatus according to Supplementary Note 9, the length of the inner wall of the gas supply area may be larger than the length of the inner wall of the gas exhaust area.

(Supplementary Note 11)

In the substrate processing apparatus according to any one of Supplementary Notes 1 to 10, an opening may be formed at the lower end of the boundary wall between the gas supply area and the cylindrical portion.

(Supplementary Note 12)

In the substrate processing apparatus according to Supplementary Note 11, the length of the inner wall of the gas supply area may be smaller than the length of the cylindrical portion and may be larger than the length of the boundary wall between the gas supply area and the cylindrical portion.

(Supplementary Note 13)

In the substrate processing apparatus according to any one of Supplementary Notes 1 to 12, the vertical length of the gas supply slit may be smaller than a gap between the substrates.

(Supplementary Note 14)

In the substrate processing apparatus according to any one of Supplementary Notes 4 to 13, the number of stages of gas supply slits and gas exhaust slits may be equal to the number of substrates.

(Supplementary Note 15)

In the substrate processing apparatus according to any one of Supplementary Notes 4 to 14, the number of rows of gas supply slits and gas exhaust slits may be equal to the number of spaces in the gas supply area and the number of spaces in the gas exhaust area.

(Supplementary Note 16)

In the substrate processing apparatus according to Supplementary Note 15, the lateral lengths of the gas supply slit and the gas exhaust slit may be equal to the lateral lengths of the space of the gas supply area and the space of the gas exhaust area.

(Supplementary Note 17)

In the substrate processing apparatus according to Supplementary Note 1, a temperature measurement area in which a temperature sensor for measuring the internal temperature of the reaction tube is disposed may be formed adjacent to the gas exhaust area.

(Supplementary Note 18)

According to another aspect of the present disclosure, there is provided a method of manufacturing a semiconductor device and processing a substrate, including: transferring a substrate into a cylindrical portion of a reaction tube including the cylindrical portion with its upper end closed and its lower end opened, a gas supply area formed outside one side wall of the cylindrical portion, and a gas exhaust area formed outside the other side wall of the cylindrical portion opposite the gas supply area; supplying a processing gas into the cylindrical portion from the gas supply area having an inner wall which partitions the interior of the gas supply area into a plurality of spaces; and exhausting the internal atmosphere of the cylindrical portion from the gas exhaust area having an inner wall which partitions the interior of the gas exhaust area into a plurality of spaces.

(Supplementary Note 19)

According to another aspect of the present disclosure, there is provided a program that causes a computer to perform a process of: transferring a substrate into a cylindrical portion of a reaction tube including the cylindrical portion with its upper end closed and its lower end opened, a gas supply area formed outside one side wall of the cylindrical portion, and a gas exhaust area formed outside the other side wall of the cylindrical portion opposed to the gas supply area; supplying a processing gas into the cylindrical portion from the gas supply area having an inner wall which partitions the interior of the gas supply area into a plurality of spaces; and exhausting the internal atmosphere of the cylindrical portion from the gas exhaust area having an inner wall which partitions the interior of the gas exhaust area into a plurality of spaces, or a non-transitory computer-readable recording medium storing the program.

(Supplementary Note 20)

According to another aspect of the present disclosure, there is provided a reaction tube including: a cylindrical portion with its upper end closed and its lower end opened; a gas supply area formed outside one side wall of the cylindrical portion; and a gas exhaust area formed outside the other side wall of the cylindrical portion opposed to the gas supply area, wherein each of the gas supply area and the gas exhaust area has an inner wall which partitions the interior of each of the gas supply area and the gas exhaust area into a plurality of spaces.

INDUSTRIAL USE OF THE PRESENT DISCLOSURE

According to the substrate processing apparatus, the method of manufacturing a semiconductor device and the reaction tube of the present disclosure, it is possible to reduce the volume of the reaction tube and improve the replacement efficiency of a processing gas.

EXPLANATION OF REFERENCE NUMERALS

280: controller (control part), 200: wafer, 201: process chamber, 202: processing furnace, 203: reaction tube, 207:

heater, 222: gas supply area, 224: gas exhaust area, 231: exhaust pipe, 310*a* to 310*f*: gas supply pipe.

What is claimed is:

1. A substrate processing apparatus comprising:
   a substrate holder configured to hold a plurality of substrates, which are vertically arranged in multiple stages;
   a process vessel configured to accommodate the substrate holder and process the substrates;
   a first nozzle, a second nozzle, and a third nozzle, each of which elongates in a direction of arrangement of the plurality of substrates, includes a plurality of gas supply holes that are opened toward a gas exhaust area and correspond to the substrates, respectively, and is configured to supply a gas into the process vessel; and
   an exhaust pipe configured to exhaust an internal atmosphere of the process vessel,
   wherein the process vessel includes:
      a cylindrical portion having an upper end that is closed and a lower end that is open;
      a first convex portion protruding from a side wall of the cylindrical portion toward an outside of the side wall of the cylindrical portion and forming therein a gas supply area in which the first nozzle, the second nozzle and the third nozzle are disposed;
      a second convex portion protruding from the side wall of the cylindrical portion at a position opposite a part of the gas supply area and forming therein the gas exhaust area;
      a first boundary wall forming a boundary between the gas exhaust area and the cylindrical portion;
      a second boundary wall forming a boundary between the gas supply area and the cylindrical portion, and including a plurality of first openings, a plurality of second openings, and a plurality of third openings; and
      an exhaust port formed on a lower part of an outer wall of the second convex portion at a position opposite to the second nozzle and connected to the exhaust pipe,
   wherein the first nozzle is configured to supply a first gas,
   wherein the second nozzle is arranged between the first nozzle and the third nozzle, and is configured to supply a second gas,
   wherein the first nozzle and the third nozzle are configured to supply an inert gas when the second nozzle supplies the second gas,
   wherein the second gas and the first gas are supplied separately into the cylindrical portion,
   wherein the first boundary wall includes exhaust openings formed to correspond to the substrates, respectively, and configured to exhaust the internal atmosphere of the cylindrical portion,
   wherein the number of the plurality of first openings and the number of the plurality of third openings correspond to the number of the plurality of substrates in the direction of arrangement of the plurality of substrates,
   wherein the plurality of gas supply holes of the first nozzle corresponds to the plurality of first openings, respectively,
   wherein the plurality of gas supply holes of the second nozzle corresponds to the plurality of second openings, respectively, and is oriented to a center of the process vessel,
   wherein the plurality of gas supply holes of the third nozzle corresponds to the plurality of third openings, respectively,
   wherein the gas supply area is divided by two inner walls into three spaces,
   wherein a second space of the three spaces fluidically communicates directly with the plurality of second openings, and
   wherein a first space and a third space of the three spaces that are adjacent to the second space fluidically communicate directly with the plurality of first openings and the plurality of third openings, respectively.

2. The substrate processing apparatus of claim 1, wherein the plurality of second openings is arranged between the plurality of first openings and the plurality of third openings,
   wherein the second gas contains a silicon source gas, and the first gas contains $NH_3$ gas, and
   wherein the second gas and the first gas are supplied alternately during processing of the substrates.

3. The substrate processing apparatus of claim 1, wherein the plurality of gas supply holes of the second nozzle is positioned at centers of the plurality of second openings, respectively.

4. The substrate processing apparatus of claim 1, wherein the plurality of first openings, the plurality of second openings, or the plurality of third openings extend in a circumferential direction of the cylindrical portion.

5. The substrate processing apparatus of claim 1, wherein the plurality of first openings is formed as slits at the boundary at a position facing the plurality of gas supply holes of the first nozzle, and
   wherein heights and widths of the slits are larger than heights and widths of the plurality of gas supply holes of the first nozzle, respectively.

6. The substrate processing apparatus of claim 1, further comprising two buffer regions formed respectively in two of the three spaces and above upper ends of nozzles, which are introduced to the two of the three spaces for supplying the first gas.

7. The substrate processing apparatus of claim 5, further comprising a buffer region formed in the gas supply area and above an upper end of the first nozzle.

8. The substrate processing apparatus of claim 1, wherein an opening is formed at a lower end of the boundary between the gas supply area and the cylindrical portion.

9. The substrate processing apparatus of claim 1, wherein lengths of inner walls of the gas supply area are smaller than a length of the cylindrical portion and are larger than a length of the boundary between the gas supply area and the cylindrical portion.

10. The substrate processing apparatus of claim 1, further comprising a controller configured to operate a cycle of:
    supplying the second gas from the second nozzle by opening a second valve;
    evacuating the second gas from the process vessel by a vacuum pump;
    supplying the first gas from the first nozzle by opening a first valve; and
    evacuating the first gas from the process vessel by the vacuum pump.

11. The substrate processing apparatus of claim 1, wherein the upper end of the process vessel is closed by a flat wall body,
    wherein a height of the gas supply area is the same as a height of the flat wall body, and
    wherein an outer wall of the gas supply area and an outer wall of the gas exhaust area are formed in a concentric relationship with the cylindrical portion.

12. The substrate processing apparatus of claim 1, wherein the first nozzle is connected to a first gas source and an inert gas source, the second nozzle is connected to a second gas source and an inert gas source, and the third nozzle is connected to an inert gas source.

13. A substrate processing apparatus comprising:
a substrate holder configured to hold a plurality of substrates;
a process vessel configured to accommodate the substrate holder and process the substrates;
a processing gas supply part configured to supply at least two kinds of processing gases into the process vessel; and
an exhaust part configured to exhaust an internal atmosphere of the process vessel,
wherein the process vessel includes:
a cylindrical portion having an upper end that is closed and a lower end that is open;
a gas supply area which is formed to protrude from a side wall of the cylindrical portion toward an outside of the side wall of the cylindrical portion and divided into a plurality of spaces, at least one of which faces to an exhaust opening; and
a gas exhaust area which is formed on and outside the side wall of the cylindrical portion at a position opposite a part of the gas supply area,
wherein the gas supply area includes:
a plurality of first openings formed at a boundary between a first space of the plurality of spaces and an inner space of the cylindrical portion, and configured to supply a first gas of the processing gases simultaneously to the respective substrates;
a plurality of second openings allowing a second gas of the processing gases to flow simultaneously from a second space of the plurality of spaces to the respective substrates;
a plurality of third openings formed at a boundary between a third space of the plurality of spaces and the inner space of the cylindrical portion, and configured to supply the first gas of the processing gases simultaneously to the respective substrates; and
three nozzles including one or more gas supply holes opened toward a center of the process vessel,
wherein the second gas and the first gas are supplied into the cylindrical portion without mixing in the gas supply area,
wherein the gas exhaust area includes:
the exhaust opening formed at a boundary between the gas exhaust area and the inner space of the cylindrical portion, and configured to exhaust the internal atmosphere of the cylindrical portion,
wherein the plurality of first openings is arranged at both sides of the plurality of second openings, and
wherein the three nozzles include:
a first nozzle which elongates in a direction of arrangement of the plurality of substrates in the first space, includes a plurality of gas supply holes positioned respectively on the plurality of first openings, and is configured to supply the first gas;
a second nozzle; and
a third nozzle which elongates in the direction of arrangement of the plurality of substrates in the third space, includes a plurality of gas supply holes positioned respectively on the plurality of third openings, and is configured to supply the first gas.

14. The substrate processing apparatus of claim 13, wherein heights of the plurality of gas supply holes of the first nozzle are smaller than those of corresponding ones of the plurality of first openings.

15. The substrate processing apparatus of claim 13, wherein the plurality of first openings is formed as slits at the boundary at a position facing the plurality of gas supply holes of the first nozzle,
wherein heights and widths of the slits are larger than heights and widths of the plurality of gas supply holes of the first nozzle, respectively.

16. A substrate processing apparatus comprising:
a substrate holder configured to hold a plurality of substrates, which are vertically arranged in multiple stages;
a process vessel configured to accommodate the substrate holder and process the substrates, the process vessel including:
a cylindrical portion having an upper end that is closed and a lower end that is open;
a gas supply area which is formed to protrude from a side wall of the cylindrical portion toward an outside of the side wall of the cylindrical portion and includes a first sub-area, a second sub-area, and a third sub-area that are arranged in a circumferential direction and accommodate a first nozzle, a second nozzle, and a third nozzle, respectively;
a boundary wall forming a boundary between the gas supply area and the cylindrical portion, and including a plurality of first openings, a plurality of second openings, and a plurality of third openings; and
a gas exhaust area which is formed on and outside the side wall of the cylindrical portion at a position opposite a part of the gas supply area;
a processing gas supply part configured to supply at least two kinds of processing gases into the process vessel;
an exhaust part configured to exhaust an internal atmosphere of the process vessel; and
nozzles including the first nozzle, the second nozzle, and the third nozzle that are detachably installed, respectively, in the first sub-area, the second sub-area, and the third sub-area, and connected to the processing gas supply part,
wherein the plurality of first openings and the plurality of third openings are formed as a plurality of gas supply slits,
wherein the first sub-area and the third sub-area fluidically communicate directly with the plurality of first openings and the plurality of third openings, respectively,
wherein the gas supply area is formed to have a lower end portion that is open,
wherein the first nozzle includes a plurality of gas supply holes corresponding to the plurality of first openings, respectively,
wherein the second nozzle includes a plurality of gas supply holes corresponding to the plurality of second openings, respectively,
wherein the third nozzle includes a plurality of gas supply holes corresponding to the plurality of third openings, respectively,
wherein at least one of the nozzles is installed along a lengthwise direction from a lower side of the gas supply area to an upper side of the gas supply area, and includes a side surface on which gas supply holes respectively facing the gas supply slits are formed to supply at least one of the processing gases directly toward a center of the process vessel,
wherein each center of the gas supply holes is positioned at a central portion of a vertical width of the corresponding gas supply slit, and
wherein the number of the plurality of first openings and the number of the plurality of third openings correspond to the number of the plurality of substrates in the direction of arrangement of the plurality of substrates.

17. The substrate processing apparatus of claim 16, wherein the second nozzle is configured to supply silicon source gas, and the first nozzle and the third nozzle are configured to supply an inert gas, carrier gas or $NH_3$ gas.

18. The substrate processing apparatus of claim 1, wherein at least one of the plurality of first openings, the plurality of second openings, or the plurality of third openings makes a gas to flow more in a lateral direction rather than a vertical direction.

* * * * *